US005731045A

United States Patent [19]

Dearnaley et al.

[11] Patent Number: 5,731,045
[45] Date of Patent: Mar. 24, 1998

[54] APPLICATION OF DIAMOND-LIKE CARBON COATINGS TO COBALT-CEMENTED TUNGSTEN CARBIDE COMPONENTS

[75] Inventors: Geoffrey Dearnaley; James Lankford, Jr., both of San Antonio, Tex.

[73] Assignee: Southwest Research Institute, San Antonio, Tex.

[21] Appl. No.: 592,077

[22] Filed: Jan. 26, 1996

[51] Int. Cl.$^6$ .................................................... B05D 3/06
[52] U.S. Cl. .................... 427/527; 427/525; 427/523; 427/122; 427/249; 427/402
[58] Field of Search .................................. 427/525, 527, 427/249, 523, 122, 402, 2.26

[56] References Cited

U.S. PATENT DOCUMENTS

| | | |
|---|---|---|
| 3,662,440 | 5/1972 | Snedeker et al. . |
| 3,707,006 | 12/1972 | Bokoros et al. . |
| 3,717,522 | 2/1973 | Shirato et al. . |
| 4,362,681 | 12/1982 | Spector et al. . |
| 4,410,611 | 10/1983 | MacIver . |
| 4,452,827 | 6/1984 | Kolev et al. . |
| 4,465,715 | 8/1984 | Manabe et al. . |
| 4,486,286 | 12/1984 | Lewin et al. . |
| 4,495,044 | 1/1985 | Banks . |
| 4,554,208 | 11/1985 | MacIver et al. . |
| 4,647,494 | 3/1987 | Meyerson et al. . |
| 4,698,236 | 10/1987 | Kellogg et al. . |
| 4,725,345 | 2/1988 | Sakamoto et al. . |
| 4,743,493 | 5/1988 | Sioshansi et al. . |
| 4,746,538 | 5/1988 | Mackowski . |
| 4,756,964 | 7/1988 | Kincaid et al. . |
| 4,770,902 | 9/1988 | Barlow et al. . |
| 4,772,513 | 9/1988 | Sakamoto et al. . |
| 4,778,469 | 10/1988 | Lin et al. . |
| 4,822,355 | 4/1989 | Bhuvaneshwar . |
| 4,822,466 | 4/1989 | Rabalais et al. . |
| 4,842,937 | 6/1989 | Meyer et al. . |
| 4,877,677 | 10/1989 | Hirochi et al. . |
| 4,961,958 | 10/1990 | Desphandey et al. . |
| 4,966,803 | 10/1990 | Pluyter et al. . |
| 4,981,071 | 1/1991 | Enke . |
| 4,992,298 | 2/1991 | Deutchman et al. . |
| 5,009,923 | 4/1991 | Ogata et al. . |
| 5,028,451 | 7/1991 | Ito et al. . |
| 5,064,682 | 11/1991 | Kiyama et al. . |
| 5,084,151 | 1/1992 | Vallana et al. . |
| 5,130,161 | 7/1992 | Mansur et al. . |
| 5,133,757 | 7/1992 | Sioshansi et al. . |
| 5,133,845 | 7/1992 | Vallana et al. . |
| 5,135,808 | 8/1992 | Kimock et al. . |
| 5,169,597 | 12/1992 | Davidson et al. . |
| 5,169,710 | 12/1992 | Hahn et al. . |
| 5,192,330 | 3/1993 | Chang et al. . |
| 5,192,523 | 3/1993 | Wu et al. . |
| 5,219,363 | 6/1993 | Crowninshield et al. . |
| 5,228,451 | 7/1993 | Bales et al. . |
| 5,249,554 | 10/1993 | Tamor et al. . |
| 5,252,174 | 10/1993 | Deguchi et al. . |
| 5,270,252 | 12/1993 | Papanicolaou . |
| 5,314,492 | 5/1994 | Hamilton et al. . |
| 5,391,407 | 2/1995 | Dearnaley . |
| 5,415,704 | 5/1995 | Davidson . |
| 5,425,777 | 6/1995 | Sarkinsian et al. . |
| 5,593,719 | 1/1997 | Dearnaley et al. ............. 427/2.26 |
| 5,645,900 | 7/1997 | Ong et al. . |

FOREIGN PATENT DOCUMENTS

| | | |
|---|---|---|
| 0 548 788 | 6/1993 | European Pat. Off. . |
| 0 548 799 A1 | 6/1993 | European Pat. Off. . |
| 62-196371 | 8/1987 | Japan . |
| 62-202897 | 9/1987 | Japan . |
| 1147067-A | 6/1989 | Japan . |

OTHER PUBLICATIONS

Palshin et al, Thin Solid Films 270 (1995) pp. 165–172.
J. Lankford, et al., "Adherence of Diamondlike Carbon Coatings on total Joint Substrate Materials," *Nuclear Instruments and Methods in Physics Research B80/81*, Part II, 1993, 1441–1445.
John H. Dumbleton, Ph.K., "The Clinical Significance of Wear in Total Hip and Knee Prostheses," *Journal of Biomaterials Applications*, 3, Jul. 1988, 3, 10–32.
G. Dearnaley, et al., "Bioapplications of Diamond–like Carbon Coatings," 4th World Biomaterials Congress, Berlin, Apr. 1992. no page number.
A.M. Jones, et al., "Stress and Microstructure of Diamond–like Carbon from Ion–beam Decomposition of Hydrocarbon precursors," 2nd European Conference on Diamond, Diamond–like and Related Coatings, Nice, France, Sep. 2–6, 1991.
C.J. Bedell, et al., "Diamond–like Carbon from the Ion–beam Decomposition of Polyphenyl Ether," *Applications of Diamond Films & Related Materials*, 1991, 833–838.
J.A. Davidson, Ph.D., et al., "Surface Modification Issues for Orthopaedic Implant Bearing Surfaces", *Surface Modification Technologies V*, 1992, 1–14.
P. Bodo, et al., "Adhesion of Evaporated Titanium to Polyethylene: Effects of Ion Bombardment Pretreatment," *J. Vac. Sci A 2*, 4, Oct.–Dec. 1994, 1498–1502.
P. Gao, et al., "Surface Treatment of Ultra High Molecular Weight Polyethylene to Enhance adhesion and Conductivity Properties" presented at Physical Aspects of Polymer Science, Sep., 9–11, 1991, Univ. of Leeks, UK. no page number.
A.C. Evans, et al., "Diamond–like Carbon Applied to Bioengineering Materials," *Medical Device Technology*, May 1991, 26–29.
C.M. Agrawal, et al., "The Effects of Diamond–Like–Carbon Coatings on the Friction and Wear of Enhanced UHM-WPE–Metal Couples," 19th Annual Meeting of Society for Biomaterials, Apr. 28–May 2, 1993. no page number.
L.S. Wielunski, et al., "Improvement of Thermally Formed Nickel Silicide by Ion Irradiation," *J. Vac. Sci. Technol.*, 20(2), Feb. 1982, 182–184.
R.S. Butter, et al., "Diamond–Like Carbon for Biomedical Applications," Applied Diamond Conference, Aug. 21–24, 1995, pp. 683, 688 and 690.

*Primary Examiner*—Roy V. King
*Attorney, Agent, or Firm*—Madan & Morris, PLLC

[57] ABSTRACT

The present invention uses ion beam assisted deposition to adhere a diamond-like carbon coating to a cobalt-cemented tungsten carbide substrate, resulting in the following gradient at the surface of the substrate: substrate/(metal-silicide or metal-germanide)/(silicon or germanium)/(silicon carbide or germanium carbide)/DLC.

21 Claims, No Drawings

APPLICATION OF DIAMOND-LIKE CARBON COATINGS TO COBALT-CEMENTED TUNGSTEN CARBIDE COMPONENTS

FIELD OF THE INVENTION

The present invention provides a process for firmly adhering a diamond-like carbon coating to cobalt-cemented tungsten carbide components, such as tools, dies, etc., to protect and extend the lifetime of such tools and dies.

BACKGROUND OF THE INVENTION

Cobalt-cemented tungsten carbide is a composite material that is widely used to make tools for cutting and working with metal, such as cutting tools and dies. One disadvantage of cobalt-cemented tungsten carbide is its relatively soft matrix of binder phase material. Many have attempted to harden the surface of cobalt-cemented tungsten carbide tools by coating the working surfaces with a protective layer of harder material, such as diamond or amorphous diamond-like carbon (DLC). Unfortunately, DLC coatings do not adhere well to cobalt-cemented tungsten carbide.

One reason for the poor adherence of DLC to cobalt-cemented tungsten carbide is the fact that cobalt comprises between about 5–15%—typically about 6%—of the composite. The cobalt acts as an adhesive to wet the carbide grains. The cobalt also has a catalytic effect upon the formation of graphite—a weak material. As a result, a preponderance of graphite and weak $sp^2$ bonds are formed in the coating instead of strong, three-dimensionally bonded "diamond-like" carbon.

Researchers have attempted to prevent the formation of graphite instead of DLC by removing cobalt from the surface of cobalt-cemented tungsten carbide using acid etching, plasma etching, and other methods. Unfortunately, etching reduces the necessary support for the carbide grains, leaving them susceptible to removal under stress. In an attempt to overcome this result, copper has been electroplated onto the substrate to fill voids left by the etching. Unfortunately, none of the methods currently used to promote adherence of DLC to cobalt-cemented tungsten-carbide components has been entirely successful.

An effective method for adhering a DLC coating to cobalt-cemented tungsten carbide without damaging the integrity of the substrate is sorely needed.

SUMMARY OF THE INVENTION

The present invention uses ion beam assisted deposition to form the following bonding gradient at the surface of a cobalt-cemented tungsten carbide substrate coated with DLC: substrate/(cobalt-silicide or cobalt-germanide)/(silicon or germanium)/(silicon-carbide or germanium carbide)/DLC. In order to create this gradient, the substrate is exposed to a vacuum and heated to between about 200°–600° C. (392°–1112° F.). Silicon or germanium is deposited onto the substrate while substantially simultaneously bombarding the substrate with a beam of ions at an energy, an ion arrival ratio, and for an amount of time sufficient to form an intermetallic bonding layer covered by an interlayer of silicon or germanium. A film of diamond-like carbon precursor is condensed onto the interlayer of silicon or germanium while substantially simultaneously bombarding the substrate with a second energetic beam of ions at an energy, an ion arrival ratio, and for an amount of time sufficient to form a carbide bonding layer and the outer coating of diamond-like carbon.

DETAILED DESCRIPTION OF THE INVENTION

The present invention uses ion beam assisted deposition of silicon or germanium, followed by ion beam assisted deposition of diamond-like carbon ("DLC") to form strong interatomic bonds across the DLC coating-substrate interface. In order to knit the successive layers of cobalt-(silicon or germanium)-DLC together effectively, it is necessary to supply a bond-interface for both the metal-silicon or metal-germanium bond and for the silicon-DLC or germanium-DLC bond. Without limiting the present invention, it is believed that the present method achieves this result by forming strong interatomic bonds having a character that is intermediate to the type of bonds between the atoms in the metal and the type of bonds between the atoms in the silicon or germanium interlayer. Although a combination of silicon and germanium can be used, it is preferred to use silicon or germanium, alone, because of the difference between the vaporization points of the two materials.

The present invention provides a means to convert cobalt near the surface of cobalt-cemented tungsten carbide into a material to which DLC adheres strongly. Silicon is known to form a strong bond with DLC due to the formation of a thin film of silicon carbide, SiC, at the interface between the silicon and the DLC. Germanium also should form a strong bond with DLC by forming a thin film of germanium carbide (GeC) at the interface between the germanium and the DLC. The strong bond formed between silicon or germanium and carbon is due to the similarity in nature of covalent Si—C/Ge—C bonds to covalent Si—Si/Ge—Ge bonds, respectively, and to the covalent C—C bonds found in carbon.

In bonding a covalent material, such as carbon, to a metal, such as cobalt, a graded series of materials should be formed having a progressive nature of interatomic bonding. The graded series of materials formed according to the present invention are cobalt/cobalt silicide/silicon/silicon carbide/DLC or cobalt/cobalt germanide/germanium/germanium carbide/DLC. The cobalt silicides (mono-silicide, CoSi, and di-silicide, $CoSi_2$) and cobalt germanides (mono-germanide, CoGe, and di-germanide, $CoGe_2$) have interatomic bonding that is intermetallic in nature, that is, intermediate between that of a metal and that of the covalent substance, silicon or germanium.

In order to practice the present invention, the following procedures are followed. After conventional cleaning of the component to remove superficial contaminants, such as grease, the component is placed in a vacuum chamber that has been evacuated to a base pressure of preferably less than about $10^{-5}$ torr. The component then is bombarded with ions, preferably argon ions, at an energy range between about 10–100 keV, preferably about 10 keV. This ion bombardment provides an effective means to remove some of the remaining adsorbed atoms from the surface.

The component is heated to a temperature between about 200°–600° C. (392°–1112° F.), preferably to about 300° C. (572° F.). Silicon or germanium then is deposited onto the component using known means. A preferable means is to position the workpiece directly over an electron-beam heated volatilization hearth which is heated to a preferred temperature of about 750° C. (1382° F.) for silicon, or between about 450°–550° C. (232–288° F.) for germanium. The procedure should be continued until a preferred coating thickness of between about 100–200 nm has been achieved. The thickness of the coating may be monitored by standard methods, e.g., using the frequency change of a quartz crystal oscillator.

The component preferably is simultaneously bombarded in a continuous or interrupted fashion with an energetic beam of ions, preferably nitrogen ions, at an energy between about 1–100 keV, preferably between about 5–30 keV, in order to form an intermetallic bonding layer of metal-silicide or metal-germanide at the metal-silicon/metal-germanium interface, respectively. The temperature of the cobalt-cemented tungsten carbide during this treatment should be held to between about 200°–600° C. (392°–1112° F.), preferably to about 300° C. (572° F.), in order to facilitate the solid-state chemical reaction between cobalt and silicon or germanium.

Nitrogen ions are preferred for the ion beams of the present invention because nitrogen ions are believed to actually bond with the substrate/coating or interlayer. Inert ions, such as argon and/or helium ions, will not bond with the substrate/film. The use of inert ions could result in bubbling and/or a weaker coating. Although it has not been proven, it is believed that strong carbon-nitrogen bonds form in the DLC layer when the ions used to make the DLC are nitrogen ions. In any event, the use of a beam of nitrogen ions can result in DLC coatings that increase wear resistance and decrease friction up to 5–7 times more than DLC coatings formed using other types of ions. Although nitrogen ions are preferred, other suitable ions may be used, such as argon, silicon, methane, helium, or neon.

The ratio of ions in the beam per atoms of silicon, germanium, or DLC precursor at the surface being bombarded is defined as the "ion arrival ratio." The process should be carried out at an ion arrival ratio of about 1:10, or 1 ion per 10 atoms of silicon or germanium at the surface of the substrate. The treatment should be terminated at a stage in which the surface of the coating on the substrate is still silicon- or germanium-rich, or a substantial amount of the silicon or germanium has not been converted to cobalt-silicide or cobalt-germanide, respectively. For a coating having a preferred thickness of between about 100–200 nm, the duration of the desired treatment should be about 15 minutes.

Thereafter, the component should be cooled to permit the DLC precursor to condense onto the surface of the component. Generally, the component should be cooled to below about 100° C. (212° F.), preferably without removing the component from the vacuum chamber. A suitable DLC precursor should be vaporized and condensed onto the surface of the component. Preferred precursors are polyphenyl ether or penta-phenyl-trimethyl siloxane. Other suitable precursor materials include carbon-based diffusion pump fluids which have a low vapor pressure and can be vaporized stably at room temperature. Such diffusion pump fluids include, but are not necessarily limited to: polyphenyl ether; polydimethyl siloxane; pentaphenyltrimethyl siloxane; and, elcosyl napthalene.

The DLC precursor preferably should be vaporized using an electrically heated reservoir or other thermally assisted means, under conditions in which the precursor will condense onto the surface of the substrate. Preferably at the same time, the component should be bombarded or irradiated, either in a continuous or interrupted fashion, with a second energetic beam of ions. This ions in this second ion beam preferably should be the same species and have the same energy as the ions in the first ion beam. In a preferred embodiment, the ions are nitrogen ions at an energy of between about 1–100 keV, preferably between about 5—30 keV. Other suitable ions also may be used, including but not necessarily limited to argon, silicon, methane, helium, or neon.

The function of this second ion bombardment step is to rupture at least about 80% of the carbon-hydrogen bonds in the DLC precursor, resulting in the formation of a noncrystalline coating of amorphous carbon. The energy dissipated by the energetic ion bombardment during ion beam assisted deposition is in the form of inelastic electronic excitations equivalent to at least about 100 eV for each carbon atom within the deposited coating. This energy dissipation strongly enhances adhesion of the DLC coating by rupturing and subsequently reforming interatomic bonds across the interfaces. A preferred coating thickness is between about 100 nm–10 microns.

EXAMPLE 1

A diamond-like carbon (DLC) coated cobalt-cemented tungsten-carbide sample was prepared in the following manner.

The cobalt-cemented tungsten carbide component was placed in a vacuum of about $10^{-5}$ torr and bombarded with argon ions at an energy of about 10 keV to remove any remaining adsorbed atoms from the surface. The component was heated to about 225° C. (437° F.). Silicon was evaporated by electron beam heating to about 750° C. (1382° F.) and deposited onto the component at a rate of about 0.15 nm/sec to a thickness of about 150 nm. Substantially simultaneously, the component was bombarded with nitrogen ions ($N_2+$) at an energy of about 9 keV and an ion to silicon atom ratio, or ion arrival ratio, of about 1:10. While still under vacuum, the component was cooled to 100° C. (212° F.), and polyphenyl ether was deposited onto the component to a thickness of about 1 μm. The component simultaneously was bombarded with nitrogen ions ($N_2+$) at an energy of about 9 keV and an ion arrival ratio, or ion to precursor atom ratio, of about 1:10 to form a DLC coating.

The sample was removed and subjected to a scratch test to assess the adhesion of the DLC coating. A 0.2 mm radius diamond indenter was applied with a force which increased linearly from 1–20 Newtons. No delamination of the DLC coating was observed by optical microscopy. As a further check, the scratched sample was studied by monitoring the flux of backscattered electrons from a scanning electron microscope. No difference in scattered intensity between the scratched and unaffected areas was observed, indicating that none of the underlying tungsten was exposed by the scratching. The scratch tests further revealed that the coefficient of friction of the DLC coated sample was reduced by more than a factor of 3 compared to an uncoated sample.

EXAMPLE 2

A cobalt-cemented tungsten-carbide component is placed in a vacuum of about $10^{-5}$ torr and bombarded with argon ions at an energy of about 10 keV to remove any remaining adsorbed atoms from the surface. The component is heated to about 225° C. (437° F.). Germanium is evaporated by electron beam heating to about 450° C. (232° F.) and deposited onto the component at a rate of about 0.15 nm/sec to a thickness of about 150 nm. Substantially simultaneously, the component is bombarded with nitrogen ions ($N_2+$) at an energy of about 9 keV and an ion arrival ratio of about 1:10. While still under vacuum, the component is cooled to 100° C. (212° F.), and polyphenyl ether is deposited on the surface of the component to a thickness of about 1 μm. The component simultaneously is bombarded with nitrogen ions ($N_2+$) at an energy of about 9 keV and an ion arrival ratio of about 1:10 to form a DLC coating.

The sample is removed and subjected to the tests described in Example 1 to assess the adhesion of the DLC coating. No delamination of the DLC coating is observed by optical microscopy. No difference in scattered intensity between the scratched and unaffected areas is observed, indicating that none of the underlying tungsten is exposed by the scratching. The scratch tests further reveal that the coefficient of friction of the DLC coated sample is reduced by more than a factor of 3 compared to an uncoated sample.

Persons of ordinary skill in the art will recognize that many modifications may be made to the present invention without departing from the spirit and scope of the present invention. The embodiments described herein are meant to be illustrative only and should not be taken as limiting the invention, which is defined in the following claims.

We claim:

1. A method for adhering a coating of diamond-like carbon to a cobalt-cemented tungsten carbide substrate comprising:

exposing said substrate to a vacuum of at least about $10^{-5}$ torr;

heating said substrate to a first temperature between about 200 °–600° C. (392°–1112° F.);

depositing an intermediate material selected from the group consisting of silicon and germanium onto said substrate in an amount sufficient to form an intermetallic bonding layer cohesively bonded to an interlayer of said intermediate material;

substantially simultaneously bombarding said interlayer with a first energetic beam of ions at a first energy, a first ion arrival ratio, and for a first amount of time sufficient to form said intermetallic bonding layer cohesively bonded to said interlayer;

condensing a diamond-like carbon precursor onto said interlayer at a second temperature and for a second amount time sufficient to form a film of said precursor molecules on said interlayer;

substantially simultaneously bombarding said diamond-like carbon precursor with a second energetic beam of ions at a second energy, a second ion arrival ratio, and a for third amount of time sufficient to form a carbide bonding layer cohesively bonded to an outer coating of diamond-like carbon.

2. The process of claim 1 wherein said first and second energetic beam of ions comprise ions selected from the group consisting of nitrogen, argon, silicon, methane, helium, neon, or combinations thereof.

3. The process of claim 1 wherein said second energetic beam of ions comprises nitrogen ions.

4. The process of claim 1 wherein said first and second energy of said first and second energetic beam of ions is between about 1–100 keV.

5. The process of claim 1 wherein said first and second energy of said first and second energetic beam of ions is between about 5–30 keV.

6. The process of claim 2 wherein said first and second energy of said first and second energetic beam of ions is between about 1–100 keV.

7. The process of claim 2 wherein said first and second energy of said first and second energetic beam of ions is between about 5–30 keV.

8. The process of claim 3 wherein said first and second energy of said first and second energetic beam of ions is between about 1–100 keV.

9. The process of claim 3 wherein said first and second energy of said first and second energetic beam of ions is between about 5–30 keV.

10. The process of claim 1 wherein
    said intermediate material is deposited onto said substrate to a thickness of between about 100–200 nm; and,
    said first ion arrival ratio is about 1 ion to about 10 atoms of said intermediate material.

11. The process of claim 3 wherein
    said intermediate material is deposited onto said substrate to a thickness of between about 100–200 nm; and,
    said first ion arrival ratio is about 1 ion to about 10 atoms of said intermediate material.

12. The process of claim 4 wherein
    said intermediate material is deposited onto said substrate to a thickness of between about 100–200 nm; and,
    said first ion arrival ratio is about 1 ion to about 10 atoms of said intermediate material.

13. The process of claim 5 wherein
    said intermediate material is deposited onto said substrate to a thickness of between about 100–200 nm; and,
    said first ion arrival ratio is about 1 ion to about 10 atoms of said intermediate material.

14. The process of claim 9 wherein
    said intermediate material is deposited onto said substrate to a thickness of between about 100–200 nm; and,
    said first ion arrival ratio is about 1 ion to about 10 atoms of said intermediate material.

15. The method of claim 1 wherein, prior to condensing said diamond-like carbon precursor onto said interlayer, said substrate is cooled to below about 100° C. (212° F.).

16. The method of claim 3 wherein, prior to condensing said diamond-like carbon precursor onto said interlayer, said substrate is cooled to below about 100° C. (212° F.).

17. The method of claim 4 wherein, prior to condensing said diamond-like carbon precursor onto said interlayer, said substrate is cooled to below about 100° C. (212° F.).

18. The method of claim 5 wherein, prior to condensing said diamond-like carbon precursor onto said interlayer, said substrate is cooled to below about 100° C. (212° F.).

19. The method of claim 9 wherein, prior to condensing said diamond-like carbon precursor onto said interlayer, said substrate is cooled to below about 100° C. (212° F.).

20. The method of claim 10 wherein, prior to condensing said diamond-like carbon precursor onto said interlayer, said substrate is cooled to below about 100° C. (212° F.).

21. The method of claim 14 wherein, prior to condensing said diamond-like carbon precursor onto said interlayer, said substrate is cooled to below about 100° C. (212° F.).

* * * * *